(12) United States Patent
Panzer et al.

(10) Patent No.: US 8,389,119 B2
(45) Date of Patent: Mar. 5, 2013

(54) COMPOSITE THERMAL INTERFACE MATERIAL INCLUDING ALIGNED NANOFIBER WITH LOW MELTING TEMPERATURE BINDER

(75) Inventors: Matthew Panzer, Stanford, CA (US); Kenneth E. Goodson, Portola Valley, CA (US); Xuejiao Hu, Phoenix, AZ (US); David Mann, New York, NY (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1188 days.

(21) Appl. No.: 11/881,746

(22) Filed: Jul. 26, 2007

(65) Prior Publication Data
US 2009/0068387 A1    Mar. 12, 2009

Related U.S. Application Data

(60) Provisional application No. 60/834,849, filed on Jul. 31, 2006.

(51) Int. Cl.
*H01L 23/373* (2006.01)
*H01L 23/42* (2006.01)

(52) U.S. Cl. ........ 428/408; 165/185; 264/261; 428/113; 428/114; 428/119; 428/293.1

(58) Field of Classification Search .................. 136/230, 136/201; 445/24, 50; 165/80.3, 80.4; 428/113, 428/114, 119, 293.1
See application file for complete search history.

(56) References Cited

U.S. PATENT DOCUMENTS

| | | | |
|---|---|---|---|
| 2003/0117770 A1 | 6/2003 | Montgomery et al. | |
| 2004/0009353 A1 | 1/2004 | Knowles et al. | |
| 2005/0072334 A1* | 4/2005 | Czubarow et al. | 106/270 |
| 2005/0145367 A1* | 7/2005 | Hannah et al. | 165/80.3 |
| 2005/0150887 A1 | 7/2005 | Taya et al. | |
| 2005/0171269 A1 | 8/2005 | Hu et al. | |
| 2005/0224220 A1 | 10/2005 | Li et al. | |
| 2006/0073332 A1 | 4/2006 | Huang et al. | |
| 2007/0116957 A1* | 5/2007 | Pan et al. | 428/408 |
| 2007/0277866 A1* | 12/2007 | Sander et al. | 136/230 |

* cited by examiner

*Primary Examiner* — Ellen S Wood
(74) *Attorney, Agent, or Firm* — Lumen Patent Firm

(57) ABSTRACT

A thermal interface material includes a mechanically compliant vertically aligned nanofiber film and a binder material for joining the nanofibers of the film to the surfaces of two substrates. Preferably, the binder material comprises a non-hydrocarbon-based material such as a metallic eutectic with a melting temperature below a nanofiber thermal damage threshold temperature of the film. The film is grown on a substrate which is then bonded to another substrate by the binder material in an adhesion process that may include pressure and heat. Alternatively, the film may be released from the substrate to produce a stand-alone thermal tape which may later be placed between two substrates and bonded.

2 Claims, 3 Drawing Sheets

COMPOSITE THERMAL INTERFACE MATERIAL INCLUDING ALIGNED NANOFIBER WITH LOW MELTING TEMPERATURE BINDER

CROSS-REFERENCE TO RELATED APPLICATIONS

This application claims priority from U.S. provisional patent application No. 60/834,849 filed Jul. 31, 2006, which is incorporated herein by reference.

FIELD OF THE INVENTION

The present invention relates generally to thermal interface materials and methods for enhancing thermal dissipation from a heat source. More specifically, it relates to improved thermal interface materials comprising carbon nanotube films.

BACKGROUND OF THE INVENTION

A thermal interface material (TIM) used for dissipating heat to a heat sink or heat spreader preferably has a high intrinsic thermal conductivity. In addition, it is desirable that the TIM allows for high thermal conductivity at its contact with other materials. An effective TIM is typically mechanically compliant in order to optimize the area of contact. Examples of some known thermal interface materials include thermal greases, epoxy adhesives, and thermal gels such as silicones or olefins.

Carbon nanotube (CNT) composite films comprising aligned arrays of nanofibers have extremely high intrinsic thermal conductivity, and are thus attractive candidates for a TIM. For example, US Pat. Pub. 2005/0171269 describes a composite CNT TIM containing randomly oriented CNTs in a matrix material such as thermal grease. The thermal conductivity of such designs, however, is limited by the random orientation of the CNTs in the matrix. Accordingly, other CNT composites have used aligned CNTs vertically grown in arrays. These arrays may be made with interstitial filling material (e.g., polymer or metal), such as described in US Pat. Pub. 2003/0117770, US Pat. Pub. 2005/0224220, and US Pat. Pub. 2006/0073332. However, such materials can have a large thermal resistance at their contact interface with other materials, severely reducing the net thermal performance of a potential CNT composite TIM.

Some known techniques for reducing surface contact resistance include topography matching (e.g., polishing both surfaces to be flat) as in US Pat. Pub. 2003/0117770, the use of thermal grease as in US Pat. Pub. 2005/0150887, and the use of compliant thermal interface materials such as Microfaze A6 which is a gel sandwiching an aluminum film. In US Pat. Pub. 2004/0009353 Knowles describes techniques for reducing surface contact resistance including the use of phase change materials such as Hi-Flow 225U which is a wax with embedded thermally conductive particles, the application of heat and pressure to the TIM, and the use of nanofibril "whiskers". Knowles discloses an aligned nanofiber array sandwiched between two sheets of phase change material which may be supported by release liner paper which can be peeled away before application, e.g., like a "tape."

Although the teachings of Knowles overcomes some of the problems in the art, the binder is limited to wax-based materials, and the techniques require synthesis of an interface material on the two surfaces to be put into thermal contact by the TIM. In addition, existing TIMs still suffer from poor thermal contact between the nanofibers and the substrate. Thus, it would be desirable to overcome various remaining limitations in the current state of the art by providing more versatile and better performing TIMs based on novel materials, structures, and methods.

SUMMARY OF THE INVENTION

According to one aspect of the invention, a thermal interface material is provided. The material includes a mechanically compliant CNT film positioned between a first substrate and a second substrate, and a binder material joining the nanofibers of the film to the substrates. Preferably, the binder material comprises a non-hydrocarbon-based material such as a metal alloy, eutectic, composite, or phase change material with a melting temperature below a nanofiber thermal damage threshold temperature of the film. These binders may be used include possible combinations of both high melting temperature and low melting temperature materials. Specific examples of binder materials include gallium, indium, tin, and palladium. The binder material binds the nanofiber film to the substrates to enhance thermal conductivity at the contact interface.

According to another aspect, a method of forming a thermal interface between first and second substrates is provided. A nanofiber film is positioned between the first substrate and second substrate together with a binder material that joins the nanofiber film to the substrates, forming a TIM composite between the first and second substrates. The composite is temporarily heated above a melting temperature of the binder material. In addition, pressure may be applied during the heating. The binder material may itself be a composite. Not all the materials in such a composite binder necessarily melt when the TIM is temporarily heated. The heat may be produced using various techniques including chemical, electrical, optical, and/or thermal heating.

Thus, a stand-alone tape-like material is provided, as well as an application method that does not require direct synthesis of a composite interface material on the two surface to be put in thermal contact. The tape material may be constructed independent of the surfaces to be connected. Before being used, the nanostructured thermal tape may be supported by or placed on some other intermediate material. To form the interface, the tape can be placed between the two interfaces and processed, completing the thermal contact. As an additional geometry, we present two fibers in an opposed configuration and associated variations such as location of the binder and nanofiber penetration.

According to one aspect, a thermal interface material is provided which includes a first substrate, a second substrate, a vertically aligned carbon nanotube film positioned between the first substrate and the second substrate, and a binder layer joining the carbon nanotube film to the first substrate. The binder layer includes a metal layer whose melting temperature is below a thermal damage threshold temperature of the carbon nanotube film. Preferably, the metal layer is composed of a material such as indium, gallium, tin, palladium, tungsten, titanium, nickel, gold, and/or iron. Alloys of these may also be used. The binder layer is preferably a composite layer composed of the metal layer and an adhesion layer. The adhesion layer may be composed of a material such as titanium, nickel, or palladium. The thermal interface material preferably also includes a second binder layer joining the carbon nanotube film to the second substrate. The carbon nanotube film may, in some variations, include two layers of carbon nanotubes such that nanotubes of the two layers are interleaved with each other. The two layers of carbon nanotubes may have thicknesses that differ by at least a factor of 2.

In another aspect, a thermal interface tape is provided. The tape includes a nanofiber film, a first binder layer, a second binder layer, and a backing material attached to the second binder layer. The nanofiber film is composed of vertically aligned carbon nanotubes and is sandwiched between the first binder layer and the second binder layer. The first binder layer and the second binder layer are composed of a first metal material and a second metal material, respectively, which both have melting points below a thermal damage threshold temperature of the nanofiber film. In one variation, the first binder layer includes a first chemically reactive material layer and the second binder layer includes a second chemically reactive material layer. The first chemically reactive material layer is selected to produce an exothermic chemical reaction sufficient to melt the first binder layer when brought into contact with a conjugate chemical layer. Similarly, the second chemically reactive material layer is selected to produce an exothermic chemical reaction sufficient to melt the second binder layer when brought into contact with a conjugate chemical layer.

In another aspect, a method for producing a thermal interface material is provided. The method includes synthesizing an aligned carbon nanotube film on a sacrificial substrate, depositing a first binder layer on the aligned carbon nanotube film, attaching a backing material to the first binder layer, removing the sacrificial substrate, and depositing a second binder layer on the aligned carbon nanotube film. Preferably, the first binder layer is composed of a first metal whose melting point is below a thermal damage threshold temperature of the carbon nanotube film. For example, the first metal may be indium, gallium, tin, palladium, tungsten, titanium, nickel, gold, or iron. Depositing the first binder layer may be performed by depositing an adhesion layer on the aligned carbon nanotube film followed by depositing the first metal on the adhesion layer, thereby forming a composite binder layer. The adhesion layer may be composed of a material such as titanium, nickel, or palladium. Depositing the first binder layer may also include depositing a chemically reactive layer on the first metal. The chemically reactive layer is preferably composed of a chemical selected to undergo an exothermic chemical reaction sufficient to melt the first binder layer when brought into contact with a conjugate chemical layer.

DETAILED DESCRIPTION

Figure 1A:
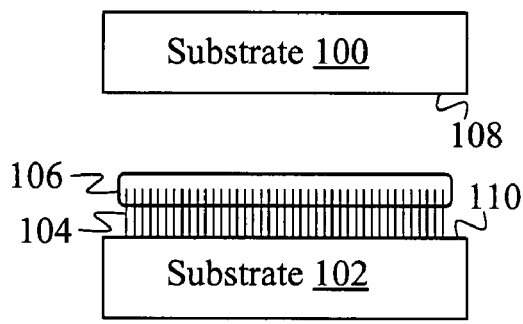
FIGS. 1A-B are schematic illustrations of an embodiment of the invention in which a binder is deposited on one nanofiber film, and the composite is pressed together and heated to form a thermal interface.
Figure 1B:
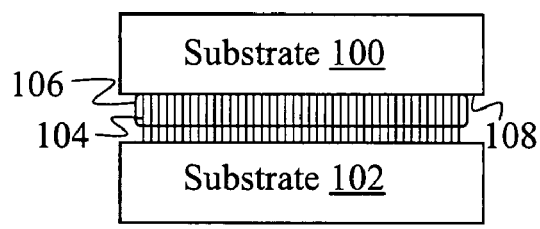

FIGS. 1A and 1B illustrate the formation of a composite thermal interface material from two substrates 100 and 102, a nanofiber film 104, and a binder 106, according to one embodiment of the invention. In typical applications, one of the substrates is a heat sink. As shown in FIG. 1A, substrate 100 initially has a bare exposed surface 108, while substrate 102 has the film of vertically aligned nanofibers 104 synthesized on its surface 110. Various well-known processes to synthesize nanofibers on substrates exist including deposition through arc discharge, laser ablation, and chemical vapor deposition (CVD). Typically in these processes, a catalysis layer less than a few nanometers thick is first deposited on the substrate (e.g., Si) to control and facilitate the nanofiber growth. The catalyst material is usually a metal oxide or metal such as iron, nickel, or cobalt. Annealing the catalyst layer at temperatures upwards of 800 C. produces a monolayer of beads which become localized sites for catalytic growth. After the formation of the catalyst layer, the catalyzed substrate is placed in a deposition chamber to synthesize the nanofibers using one of the aforementioned techniques. This fabrication procedure will tend to naturally produce highly-aligned arrays of nanofibers.

The binder 106 is deposited on nanofiber film 104 such that it covers the free ends of the nanofibers of film 104. The binder may deposited using any one of various well-known methods including chemical deposition such as CVD; physical deposition such as physical vapor deposition (PVD), evaporation, sputtering, pulsed laser deposition, or arc deposition; and direct mechanical placement methods. If the binder is a multi-component material, a combination of these techniques may be used. In some embodiments, an adhesion layer is deposited on the nanofiber film prior to the binder layer, as will be described in detail below.

The surface 108 of substrate 100 is then joined to binder 106 by applying a force between substrates 100 and 102 in order to press them together. In addition, the binder is heated to a temperature below the thermal damage threshold temperature of the nanofiber film while the pressure is applied, typically by heating the entire composite. Preferably, through the combination of heat and pressure, the tips of nanofibers 104 contact or are in close proximity to the surface 108 of substrate 100, as shown in FIG. 1B. Typically, mechanical pressure places the nanofibers and substrate within a distance comparable to the nanofiber surface roughness. For example, the surface roughness for nanofibers comprised of multi-walled nanotubes is typically less than 10 micrometers, and single-walled nanotubes can achieve surface roughness less than 100 nm. Applying adhesion pressures up to 500 kPa can enhance the nanofiber-substrate contact thorough increasing the van der Waal's interaction, nanofiber-substrate conformation, and nanofiber-substrate penetration. The application pressure will reduce the separation of the nanofibers and substrates to below the average surface roughness. The interface is formed by heating the structure to a temperature tailored to the melting temperature of the particular binder employed. For example, for an indium based binder a thermal processing temperature greater than 156 C. is used for the binder to become fluent. Furthermore, the processing temperature should remain below the damage threshold for the nanofibers, which when in contact with metals, is less than 300 C. Thermal processing should occur for sufficiently long duration for the binder to become fluent and wick through the nanofiber structure, which can occur within less than approximately 10 minutes. Heating also allows the binder to conform to the variations in heights of the nanofiber layer and surface topography of the substrate. When heat and pressure are removed, a composite thermal interface is produced. TIMs according to the present invention are capable of achieving a total thermal resistance of about 1 $m^2KMW^{-1}$, which is an order of magnitude better than that of the best existing TIMs.

The binder material 106 is preferably a mechanically compliant material with a high thermal conductivity. The binder 106 is also a material that becomes fluid at a temperature below the nanofiber thermal damage threshold temperature. Suitable binder materials include non-hydrocarbons such as metals and metal alloys, eutectics, and composites. In the case of composites, it is not necessary that all components of the binder become fluid at a temperature below the nanofiber thermal damage threshold temperature. It is sufficient that the matrix material of such a composite become fluid at such a temperature. For example, the binder may have small particles interspersed in it that remain solid when the matrix melts, or the binder may contain a layer that remains solid. Specific examples of suitable binder materials include gallium, indium, tin, palladium, tungsten, titanium, nickel, gold, and iron.

In some embodiments, a thin adhesion layer is deposited on the nanofibers prior to the deposition of the binder layer, as will be described further in relation to FIG. 3C. In the context of the present description, the adhesion layer may be considered a component of a composite binder layer, in which case the composite binder layer includes a binder material and an adhesion material. Titanium, nickel, and palladium are preferred metals for adhesion layers, with thicknesses ranging from several nanometers to one micrometer. In one example, a palladium film of 20 nm thickness is initially evaporated on the top of the CNT film to enhance the metal-CNT contact interface. The Pd deposition is followed by the deposition of several micrometers of metallic binder such as indium. Typically, the binder and adhesion layers are prepared independently of each other with different adhesion layer material being applied to the substrate and nanofiber ends.

Nanofiber films suitable for use in embodiments of the present invention may be engineered for optimal mechanical and thermal performance. For example, the nanofiber film may be mechanically and/or chemically polished to decrease surface roughness and improve thermal contact area. In addition, the density of the nanofibers in the film and its porosity may be adjusted to meet thermal and mechanical specifications of a particular application. Various known methods may be used to grow the nanofilm. For example, in one method, a 0.1 nm thick iron film is deposited using electron beam evaporation, on top of a 10 nm $SiO_2$ layer, thermally grown on a Si substrate. The iron is then annealed in oxygen at 550 C., producing a monolayer of 1.3 nm diameter iron clusters to act as catalysts for the CNT growth. The CNT synthesis is carried out in a CVD plasma system with a mixture of methane, hydrogen, and oxygen, and utilized a coupled RF plasma source at the entrance to the furnace. The length of the resulting tubes is 28 micrometers, and the volume fraction is estimated to be about 10%. The RMS roughness of the film is about 60 nm.

The above synthesis process is specific to the growth of single-wall nanotubes (SWNT). In some embodiments, multi-walled nanotubes (MWNT) may be used, in which case the synthesis process may be different. The growth process for multi-walled nanotubes is typically similar, but less stringent and more tolerant of variations. The optimal density and fiber thickness are determined by a combination of the thermal performance and mechanical compliance requirements and may differ depending on the application. Nanotube films demonstrate a wide range of densities, which are relatively difficult to control and affect the nanofiber surface roughness. MWNT arrays are typically less dense (1% vol.) than SWNTs (about 10% vol.). The nanofiber film thicknesses can range between about 10 to 300 micrometers. Currently our preliminary data does not show a strong correlation between nanotube length and thermal performance. A general trend is that shorter tubes with high densities perform better from a thermal standpoint.

Figure 2A:
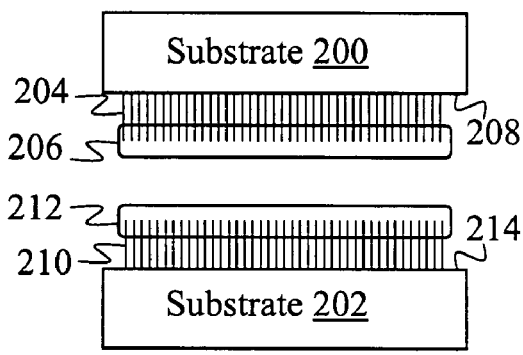
FIGS. 2A-B are schematic illustrations of an embodiment of the invention in which a binder is deposited on two nanofiber films, and the composite is pressed together and heated to form a thermal interface.
Figure 2B:
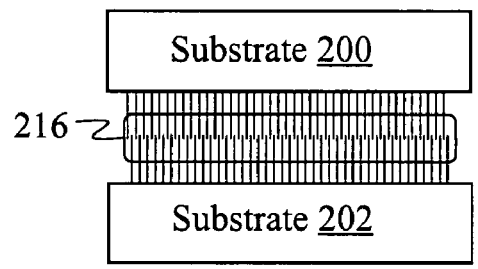

FIGS. 2A and 2B illustrate the formation of a composite thermal interface material from two substrates 200 and 202, nanofiber films 204 and 210, and binders 206 and 212, according to another embodiment of the invention. As shown in FIG. 2A, substrate 200 has the film of nanofibers 204 fabricated on its surface 208. The binder 206 is deposited on nanofiber film 204 such that it covers the free ends of the nanofibers of film 204. Similarly, substrate 202 has the film of nanofibers 210 fabricated on its surface 214. The binder 212 is deposited on nanofiber film 210 such that it covers the free ends of the nanofibers of film 210. The two substrates are then joined by pressing them together and heating in the same manner as described in relation to the embodiment of FIGS. 1A and 1B, except that in this case the two binder materials fuse to form a single binder 216, as shown in FIG. 1B. Preferably, the tips of nanofibers 204 end up in close proximity or contact with the tips of nanofibers 210. The tips of the nanofibers are preferably placed within a distance equal to or less than the average surface roughness of the nanofiber film, which is less than 10 micrometers for multi-walled nanotubes or 100 nanometers for single-walled nanotubes. The nanofiber tip proximity can be reduced through the use of pressure to form overlapping regions of nanofibers, with typical overlap distance of 50 micrometers. Within the overlapped region the inter-tube spacing will be less than 25 nanometers and will in general be inversely proportional to the density of the two arrays in contact. When heat and pressure are removed, a composite thermal interface is produced.

Figure 3A:
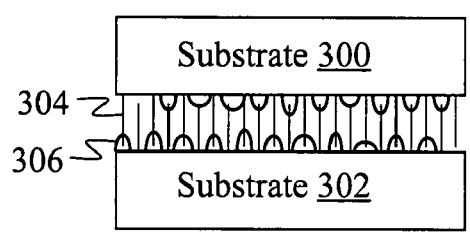
FIG. 3A is a schematic illustration of an embodiment of the invention in which nanofibers of two nanofiber films have similar lengths and interpenetrate each other, and a binder is predominantly located near the ends of the nanofibers.
Figure 3B:
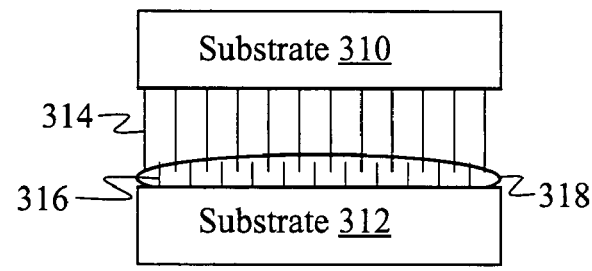
FIG. 3B is a schematic illustration of an embodiment of the invention in which nanofibers of two nanofiber films have different lengths and interpenetrate each other, and a binder is deposited to cover a film with shorter nanofibers and longer nanofibers from the other film are pressed into the binder.

FIGS. 3A and 3B illustrate additional embodiments of composite thermal interface materials. FIG. 3A is a schematic illustration of an embodiment in which nanofibers films 304 and 306 of comparable thicknesses are fabricated on opposing surfaces of two substrates 300 and 302, respectively. Binder material, such as localized binder drop 306, is also deposited on the surface of the two substrates. The nanofibers in the two films have similar lengths. The composite is formed by pressing the two substrates together and applying heat so that the fibers of the opposing films 304 and 306 are interleaved and their tips contact the binder deposited on the opposing substrate surface. The density of the nanofiber films in this embodiment is thus sufficiently low to allow the interleaving of the nanofibers. The resulting interleaved nanofiber films may thus be considered as forming a single carbon nanotube film composed of two interleaved layers.

FIG. 3B is a schematic illustration of an embodiment in which nanofibers films 314 and 316 of different thicknesses are fabricated on opposing surfaces of two substrates 310 and 312, respectively. Nanofibers 314 are longer than nanofibers 316, preferably by at least a factor of 2. A layer of binder material 318 is deposited on the surface of substrate 312 so that it covers the short nanofibers 316. Alternatively, the binder layer may be deposited on the nanofiber film 314, or on both films. The composite is formed by pressing the two substrates together and applying heat so that the long fibers 314 are interleaved with the opposing short fibers 316 and the tips of the long fibers 314 contact the binder 318.

Figure 3C:
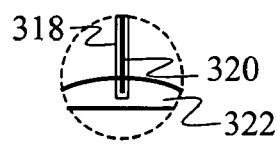
FIGS. 3C-D are schematic diagrams illustrating two embodiments in which adhesion layers are used to facilitate bonding of the nanofibers to the binder material.
Figure 3D:
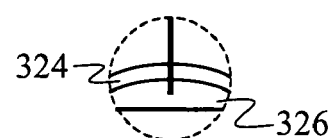

FIG. 3C is a detail view of a single nanofiber 320 inserted within a portion of binder material 322. In some embodiments, nanofibers are coated with an adhesion layer 318 to wet the nanofibers and promote adhesion to the binder material. In other embodiments, an adhesion layer 324 may be deposited on the binder material 326, such as shown in FIG. 3D, in which case the binder material and adhesion material may be considered as forming a composite binder layer.

Figure 4A:
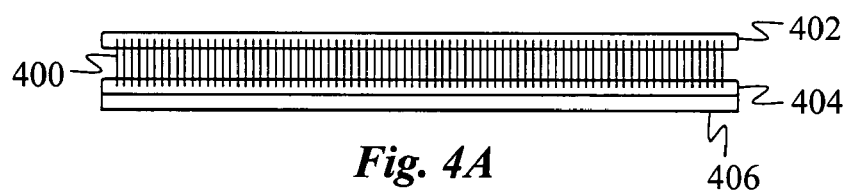
FIGS. 4A-B are cross-sectional illustrations of a nanofiber thermal tape in which the nanofibers are bound together on both ends with the low melting point binder on both ends of the nanofibers.

FIG. 4A is a cross-sectional view of a nanofiber thermal tape according to another embodiment of the invention. This stand-alone thermal tape includes a nanofiber film 400 sandwiched between two layers of binder 402 and 404. The tape may be produced by fabricating the nanofiber film 400 on a sacrificial substrate (not shown) and then depositing binder layer 402 on side of the film 400, just as described above in relation to FIG. 1A. The film 400 is then released from the substrate (e.g., by dissolving the substrate). The binder layer 404 is then deposited on the side of the nanofiber film 400 that had previously been bound to the substrate, resulting in a nanofiber film 400 with binder on both sides. Alternatively, this last step may be skipped, so that the nanofiber film has a binder on just one side. In this case, it is preferable that the binder penetrate the nanofiber film. As with other embodiments, the tape may be provided with an adhesion layer, as shown in FIGS. 3C and 3D.

For convenience in application and delivery, the tapes may be provided with a temporary backing material 406 that may be removed just prior to use. Such backing materials may be metallic based such as an aluminum foil; polymer or rubber based such as polyamide, polypropylene, nylon, or acetates; or paper based. A weak adhesive layer is preferably used to fix the backing to the tape. During fabrication, the backing material may be fixed to one side of the tape prior to removal of the sacrificial substrate to provide mechanical support to the tape.

Figure 4B:
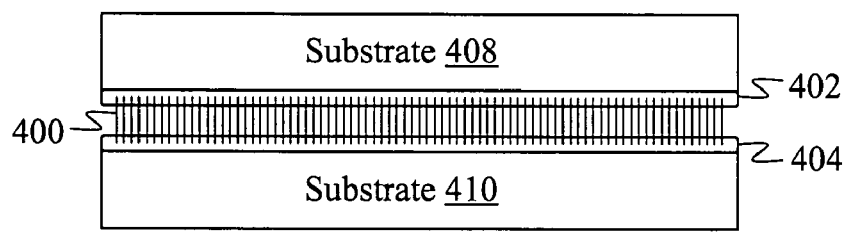

Composite thermal tapes of the present invention may be used to form a thermal interface between two substrates 408 and 410, as shown in FIG. 4B. The tape may be applied by removing the backing 406 (if present), placing the tape between opposing surfaces of the substrates 408 and 410, pressing the substrates together, and heating.

In other embodiments of the invention, the application of pressure and heat to promote adhesion may include, in addition or alternatively, electrical, thermal, optical, or chemical processing. In an electrical processing approach, for example an electric current passes either through the metallic component of the binder material directly or through an external resistive heater. In either case, resistive heating melts the binder. In a thermal process, the structure may be heated externally by an oven or with mechanical contact with an external heat source to melt the binder. In an optical process, exposure of the binder or TIM to intense optical radiation as from a laser or other source results in absorption of radiant energy that melts the binder.

Figure 5A:
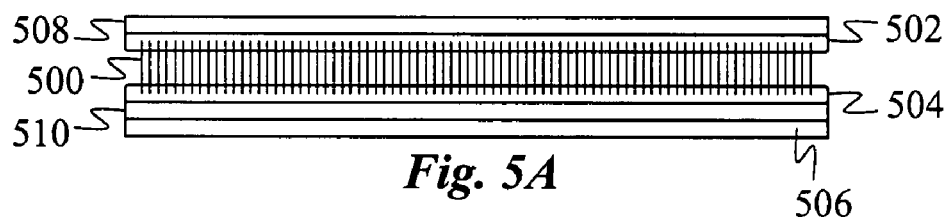
FIGS. 5A-C are cross-sectional illustrations of a nanofiber thermal tape in which reactive chemical layers are provided for melting the binder layer when the tape is applied.
Figure 5B:
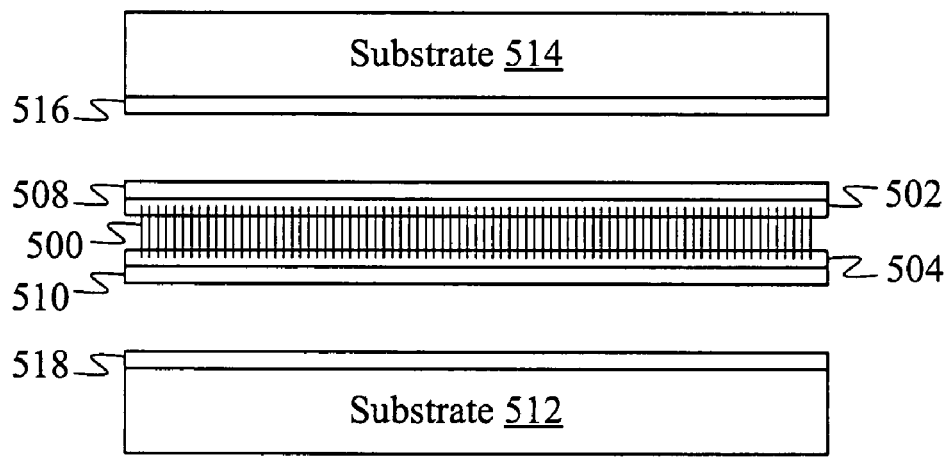
Figure 5C:
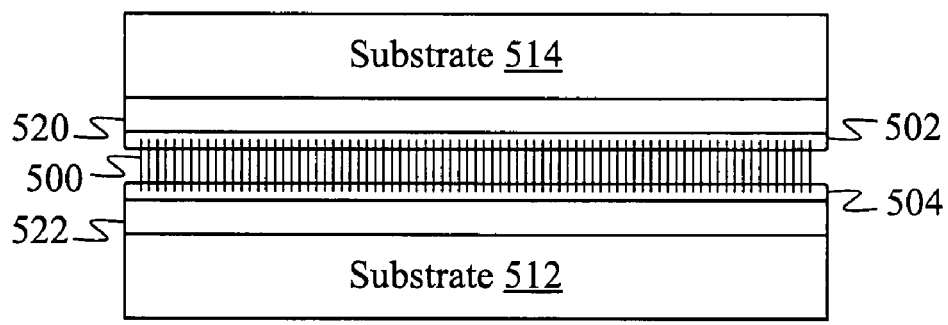

FIGS. 5A-C illustrate an embodiment of a thermal tape in which an exothermic chemical reaction is used to heat and melt the binder. As shown in FIG. 5A, a thermal tape is composed of a nanofiber layer 500 sandwiched between binder material layers 502 and 504. The nanofiber-binder layers, in turn, are sandwiched between layers 508 and 510 of a chemically reactive material. The resulting tape may be mounted on a backing material layer 506. When the tape is ready for use, the backing layer 506 is removed and the tape is positioned between substrates 512 and 514, as shown in FIG. 5B. The substrates have chemically reactive material layers 516 and 518 on their opposing surfaces. Layers 508 and 516 are chemically reactive with each other, as are layers 510 and 518, to produce an exothermic chemical reaction upon contact. The reactants are selected to produce sufficient heat to raise the temperature of the binder layers 502 and 504 above their melting points. FIG. 5C shows the resulting thermal interface. Layer 520 is the chemical product of the reaction between layers 516 and 508. Similarly, layer 522 is the product of the reaction between layers 510 and 518.

The binder materials may be multilayered composites. For example, a thin layer of high melting point metal that promotes bonding may be deposited on the nanofibers to enhance chemical contact and bonding of the low-temperature binder. For example 20 to 100 nanometers of palladium or nickel may first be deposited on the nanofiber ends, followed by a thickness of indium comparable to the roughness of the nanofiber film, which is typically less than 30 micrometers. Similar processes can be applied to the non-nanofiber coated substrate. Any of the layers can also be chemically reactive, which can advantageously heat the low melting temperature binder or catalyze nanofiber-substrate chemical bonding. Chemically reactive compounds may be used in opposing binder materials so that heat is released when they are brought into contact (e.g., 206 and 212 in FIGS. 2A-B). An example of such exothermic reactive layers include a nickel and aluminum multilayer reactive foil structure, which is produced by Reactive Nano Technologies. In addition, free nanofibers may be dispersed within the binder and aligned by applying an electromagnetic field during heating. Preferably, nanofiber concentrations in dispersion are limited to less than 2% vol. so that viscosities remain sufficiently low. The nanofibers may remain in the binder such as silicon oil or epoxy resin, or may be removed after alignments using a temporary binder such as isopropyl alcohol. Placing a dispersion of nanofibers in the bore of a magnetic filed with a strength ranging from 7 to 25 Tesla will align the nanofibers.

The invention claimed is:

1. A thermal interface tape comprising a nanofiber film, a first binder layer, a second binder layer, and a backing material, wherein the nanofiber film is composed of vertically aligned carbon nanotubes, wherein the nanofiber film is sandwiched between and permeated by the first binder layer and the second binder layer, wherein the first binder layer and the second binder layer are composed of a first metal material and a second metal material, respectively, wherein the first metal material and the second metal material have melting points below a thermal damage threshold temperature of the nanofiber film, and wherein the backing material is a temporary, removable material attached to the second binder layer; wherein the first binder layer comprises a first chemically reactive material layer and wherein the second binder layer comprises a second chemically reactive material layer, wherein the first chemically reactive material layer is selected to produce an exothermic chemical reaction sufficient to melt the first binder layer when brought into contact with a conjugate chemical layer.

2. A method for producing a thermal interface material, the method comprising synthesizing an aligned carbon nanotube film on a sacrificial substrate, depositing a first binder layer on the aligned carbon nanotube film, attaching a backing material to the first binder layer, removing the sacrificial substrate, and depositing a second binder layer on the aligned carbon nanotube film, wherein the first binder layer is composed of a first metal whose melting point is below a thermal damage threshold temperature of the carbon nanotube film; wherein depositing the first binder layer further comprises depositing a chemically reactive layer on the first metal, wherein the chemically reactive layer is composed of a chemical selected to undergo an exothermic chemical reaction sufficient to melt the first binder layer when brought into contact with a conjugate chemical layer.

* * * * *